US00RE39784E

(19) United States
(12) Reissued Patent
Hsueh

(10) Patent Number: US RE39,784 E
(45) Date of Reissued Patent: Aug. 21, 2007

(54) STRUCTURE FOR REMOVABLE COOLER

(75) Inventor: Paul Hsueh, Concord, CA (US)

(73) Assignee: Ma Laboratories, Inc., San Jose, CA (US)

(21) Appl. No.: 11/041,193

(22) Filed: Jan. 20, 2005

Related U.S. Patent Documents

Reissue of:
(64) Patent No.: 6,775,139
Issued: Aug. 10, 2004
Appl. No.: 10/337,782
Filed: Jan. 8, 2003

(51) Int. Cl.
*H05K 7/20* (2006.01)

(52) U.S. Cl. ..... 361/697; 361/695; 361/700; 361/704; 165/80.3; 165/104.33; 257/719

(58) Field of Classification Search ..... 361/685–688, 361/690–697, 704–711, 714–721; 165/80.2, 165/80.3, 80.4, 121, 122, 104.32, 104.33, 165/185, 127; 257/717–721; 174/16.3; 454/184; 62/259.2, 259.3, 259.7, 263
See application file for complete search history.

(56) References Cited

U.S. PATENT DOCUMENTS 5,109,318 A * 4/1992 Funari et al. ..... 361/710
5,335,722 A * 8/1994 Wu ..... 165/122
5,835,347 A * 11/1998 Chu ..... 361/697
5,973,921 A * 10/1999 Lin ..... 361/695
6,269,001 B1 * 7/2001 Matteson et al. ..... 361/695
6,304,442 B1 * 10/2001 Tucker et al. ..... 361/695
6,435,889 B1 * 8/2002 Vinson et al. ..... 439/247
2002/0088607 A1 * 7/2002 Lo

OTHER PUBLICATIONS

USPGPUB 2002/0088607 A1, Jul. 11, 2002, Lo.*

* cited by examiner

*Primary Examiner*—Michael Datskovsky
(74) *Attorney, Agent, or Firm*—Bever, Hoffman & Harms, LLP; Patrick T. Bever

(57) ABSTRACT

A removable cooler on the memory module wherein the PC board is able to attach on the memory module without any modification. The cooler contains a heat sink module and a cooler module. The heat sink module is combined by two heat conductive heat sinks placed oppositely and screwed or tenoned on the memory module to stimulate heat exchange above the extension part of the heat sinks. The cooler module could be a fan or heat conductive tube. As a fan, it could be buckled on the memory module socket for the extension part of the heat sinks to stimulate heat exchange. As a heat conduction tube screwed or tenoned against the extension part of the heat sinks, it stimulates heat exchange and provides heat dispensation function to assure the performance of the memory module.

10 Claims, 8 Drawing Sheets

STRUCTURE FOR REMOVABLE COOLER

Matter enclosed in heavy brackets [ ] appears in the original patent but forms no part of this reissue specification; matter printed in italics indicates the additions made by reissue.

FIELD OF THE INVENTION

The present invention relates to a cooler, especially a removable cooler on the memory of a PC.

BACKGROUND OF THE INVENTION

Traditionally, during the run time of a PC, the electronic components inside and memory module generate lots of heat, especially the new memory module required by high-level computers. The temperature of the memory module going up continuously affects operation performance, even causes the memory module to break down. Currently, a cooler designed for such a heat dispensation problem of the memory module is still unavailable.

In view of such the unavailability, the inventor of the present invention was devoted to finding a solution and accomplished structural improvement for cooler.

SUMMARY OF THE INVENTION

The main objective for the present invention is to provide a removable cooler on the memory module inside a PC, wherein the PC board is able to attach on the memory module without any modification. The cooler contains a heat sink module and a cooler module. The heat sink module combined by two pieces of heat conduction heat sinks placed oppositely is screwed or tenoned to the memory module so that the heat generated by the memory module is conducted to the extension part of the heat sink and thus stimulates heat exchange. The cooler module could be a fan or heat conduction tube. If it is a fan, it could be buckled on the memory module socket for the extension part of the two oppositely placed heat sinks to absorb the heat of the memory module and drives heat exchange. If it is a heat conductive tube screwed or tenoned against the extension of the two oppositely placed heat sinks, it absorbs the heat of the memory conducted to the extension part of the two oppositely placed heat sinks and stimulates heat exchange, thus provides heat dispensation to assure the performance of the memory module.

In the following, the embodiment illustrated is used to describe the detailed structural characteristics and operation action for the present invention

DETAILED DESCRIPTION OF THE INVENTION

Figure 1:
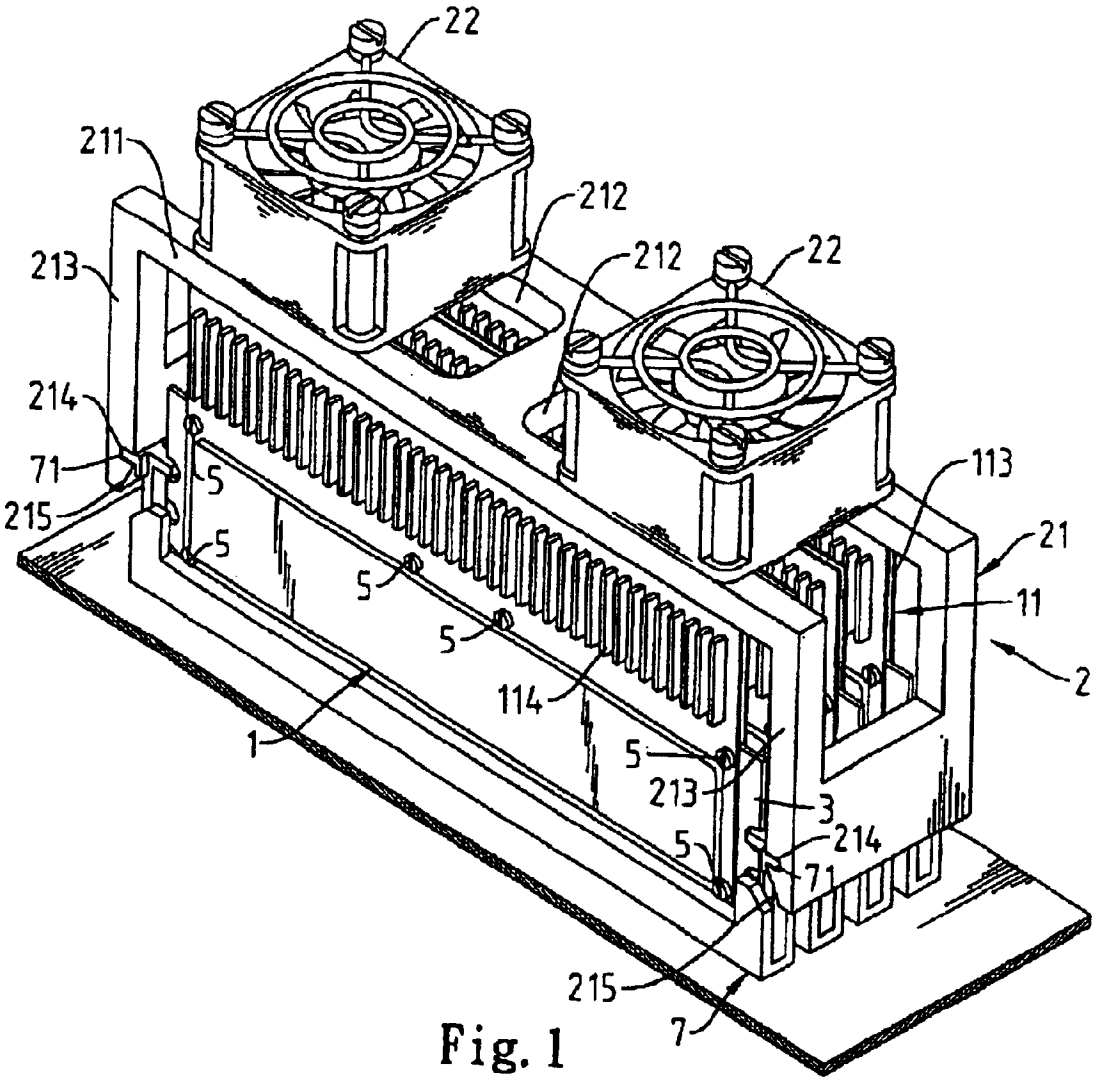
FIG. 1 is a three-dimensional illustration for better application of a removal cooler in the present invention.
Figure 2:
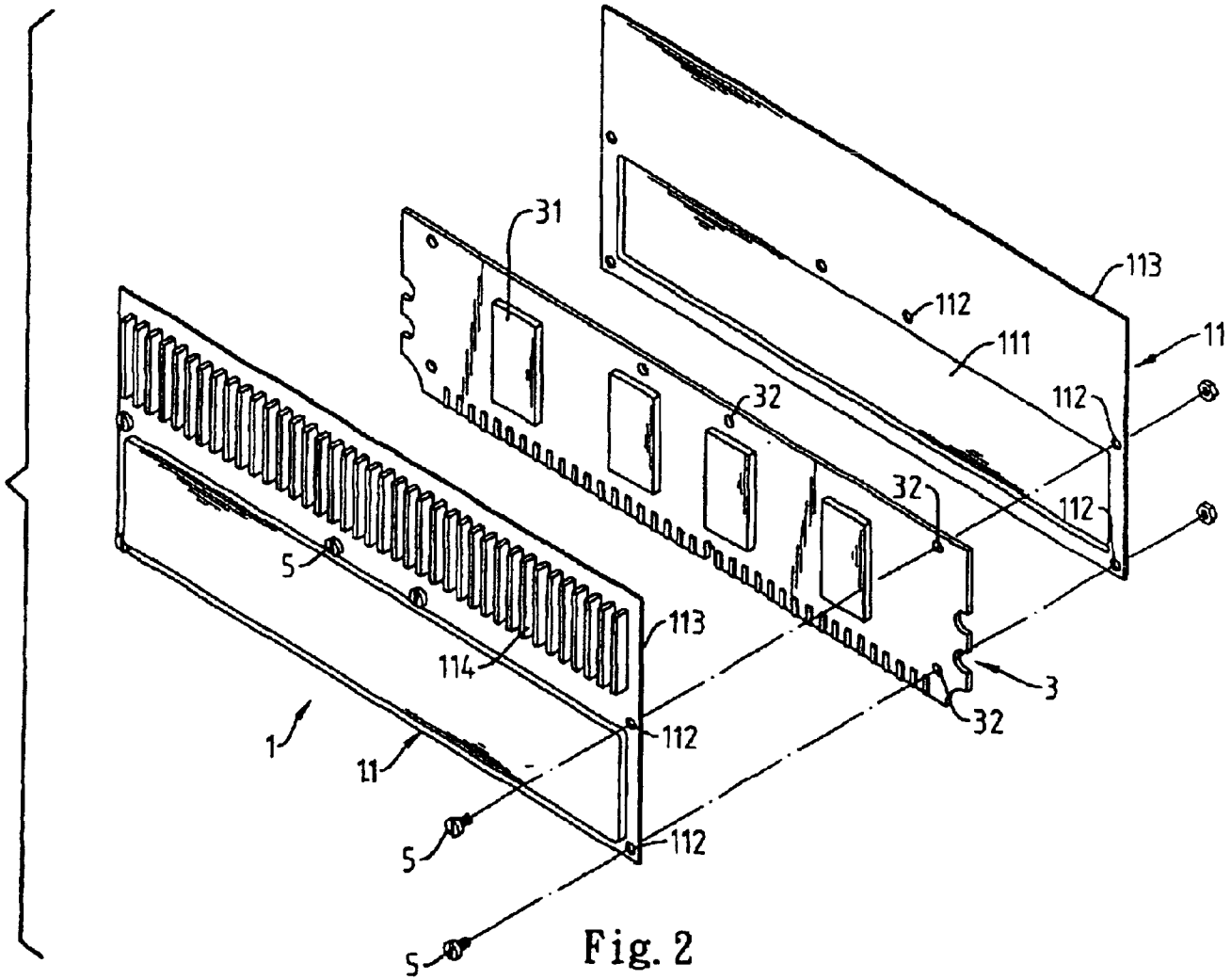
FIG. 2 is a three-dimensional illustration for deformation of a removal cooler's heat sink module in the present invention.
Figure 3:
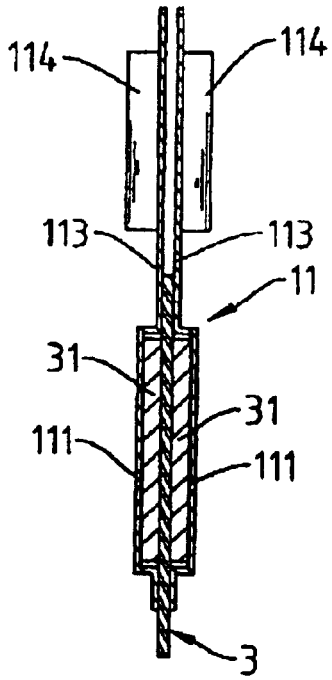
FIG. 3 is a cross-sectional illustration for a heat sink module placed above the memory module in the present invention.
Figure 4:
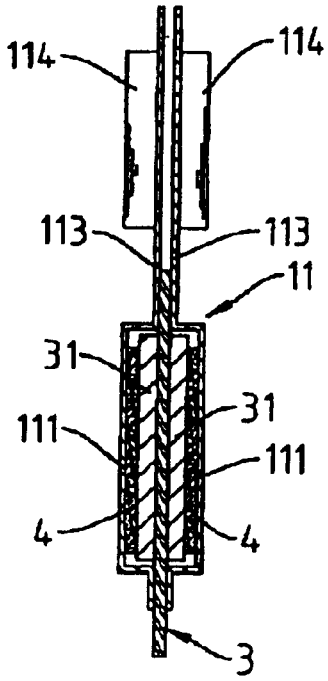
FIG. 4 is a cross-sectional illustration for heat conduction inside heat sink module placed above the memory module in the present invention.
Figure 5:
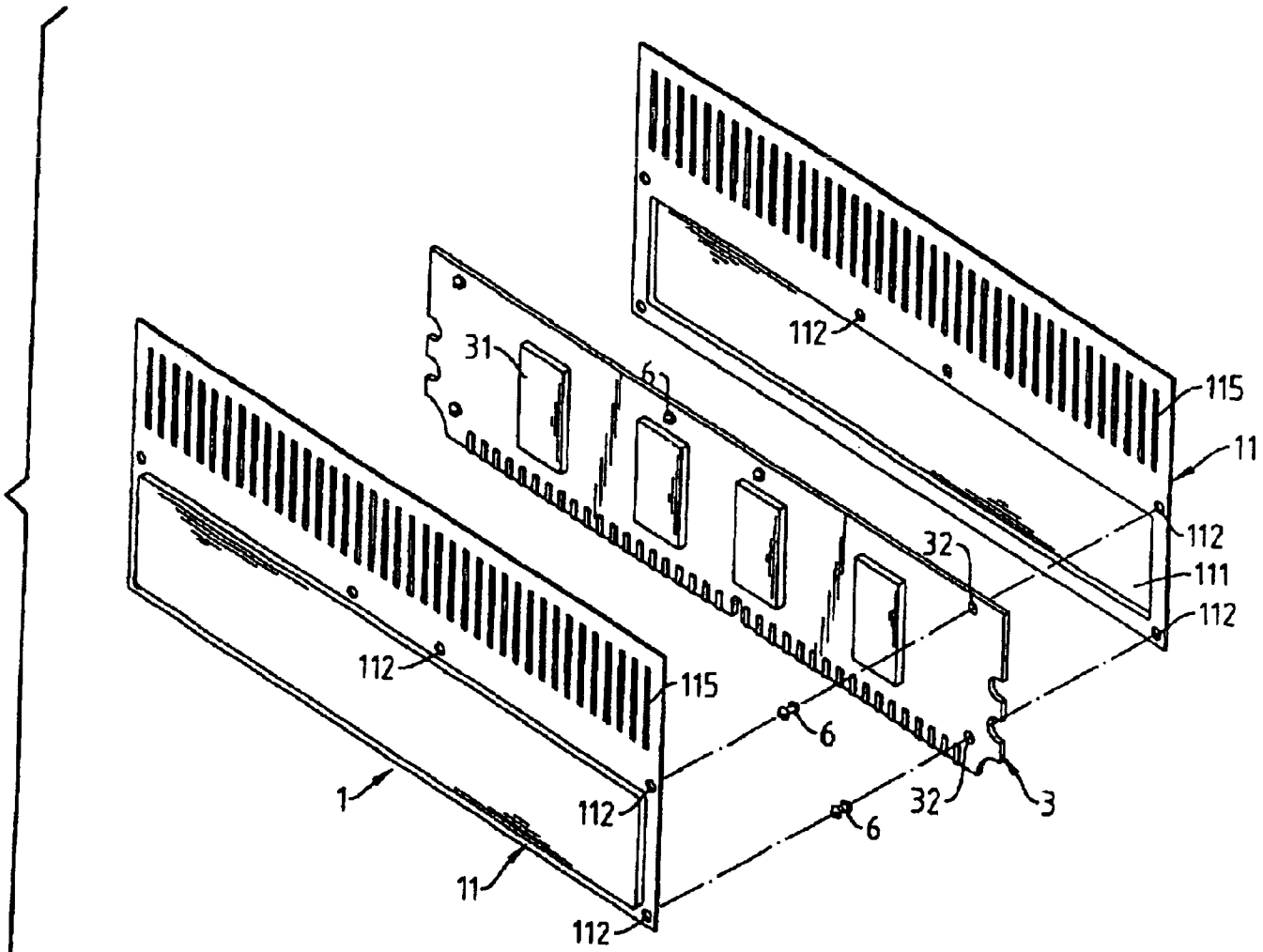
FIG. 5 is an illustration for deformation of another heat sink module covered on the memory module in the present invention.

Please refer to FIG. 1. The present invention provides a removal cooler for the memory module inside a PC, mainly consisting of a heat sink module 1 and a cooler module 2. The heat sink module 1 covered on the memory module 3 contains two pieces of heat-conductive heat sinks 11 placed oppositely. There is a concave 111 on the inner side of each heat sink 11 that shelters and contacts against the chips 31 protruding from both sides of the memory module 3 and conducts heat (as shown in FIG. 3). Otherwise, a heat conduction interface 4 is used between the chip 31 and the concave 111 for heat conduction (as shown in FIG. 4). This heat conduction interface 4 can be heat dispensation ointment or heat dispensation tape. On the two heat sinks 11 placed oppositely there are several holes 112 corresponding to the holes 32 on the memory module 3 so that the two heat sinks 11 can be screwed (as shown in FIG. 2) or tenoned (as shown in FIG. 5) to the memory module 3, on the extension part above the heat sink 11 there are several heat dispensation fins 114 (as shown in FIG. 2) or ventilators 115 (as shown in FIG. 5) for ventilation and heat dispensation.

Figure 6:
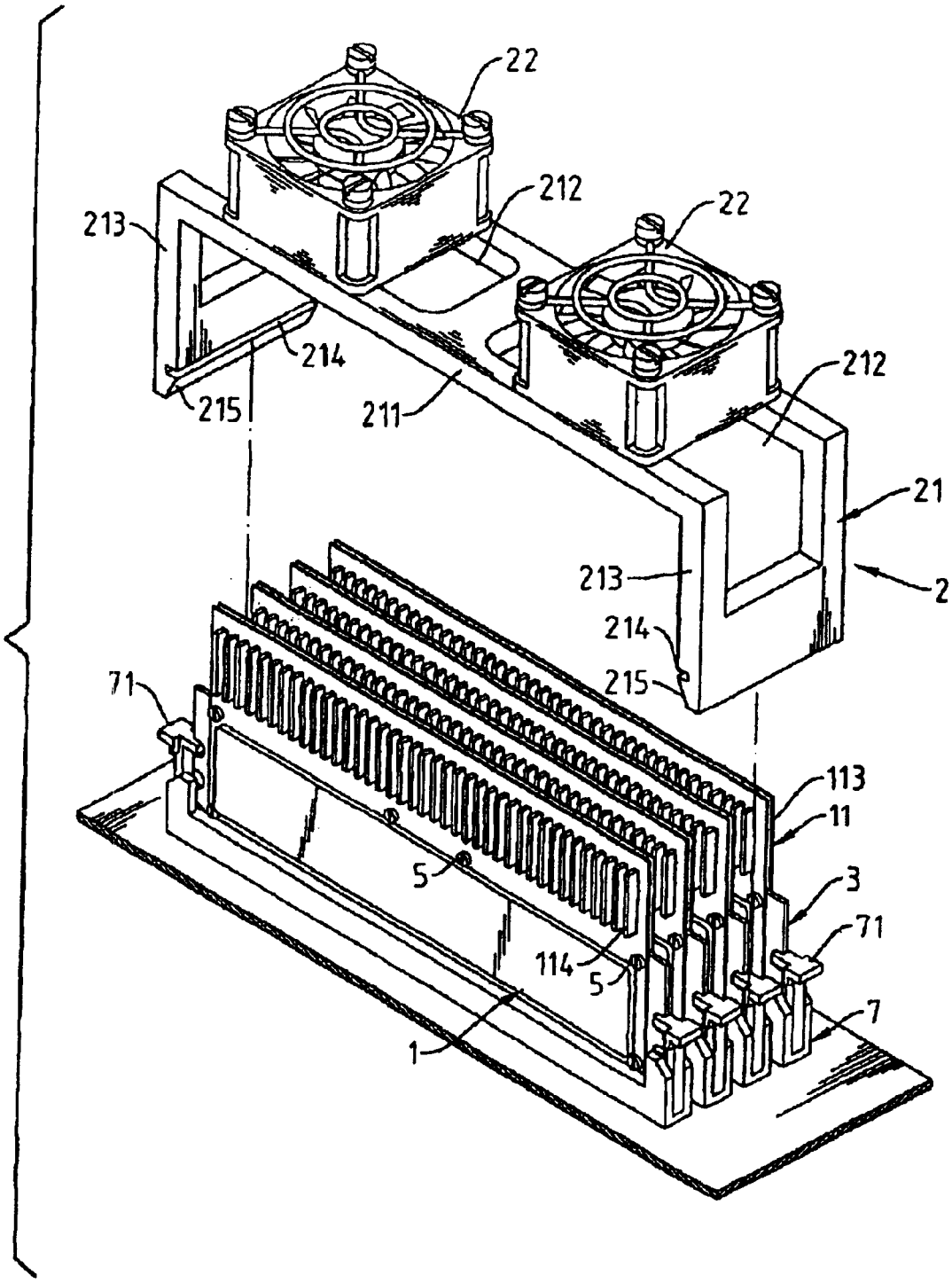
FIG. 6 is a three-dimensional illustration for deformation of the removal cooler in the present invention.

Please refer to FIG. 6. The above cooler module 2 is a fan-style frame that contains a frame 21 and at least one fan 22 (in this case two fans 22 are used). The frame 21 is a π-shaped frame with two flexible sides. On the frame's top 211 there are two holes 212 stretching to the side of the frame. There is a fan 22 placed at different angle on top of the hole, at the bottom of the hole or on one side of the hole (in this case the fan is placed on top of the hole). At the inner bottom of the frame's leg 213 on both sides of the frame 21 there is a cavity 214 and the inner bottom of the two frame's legs 213 are bevels 215.

Figure 7:
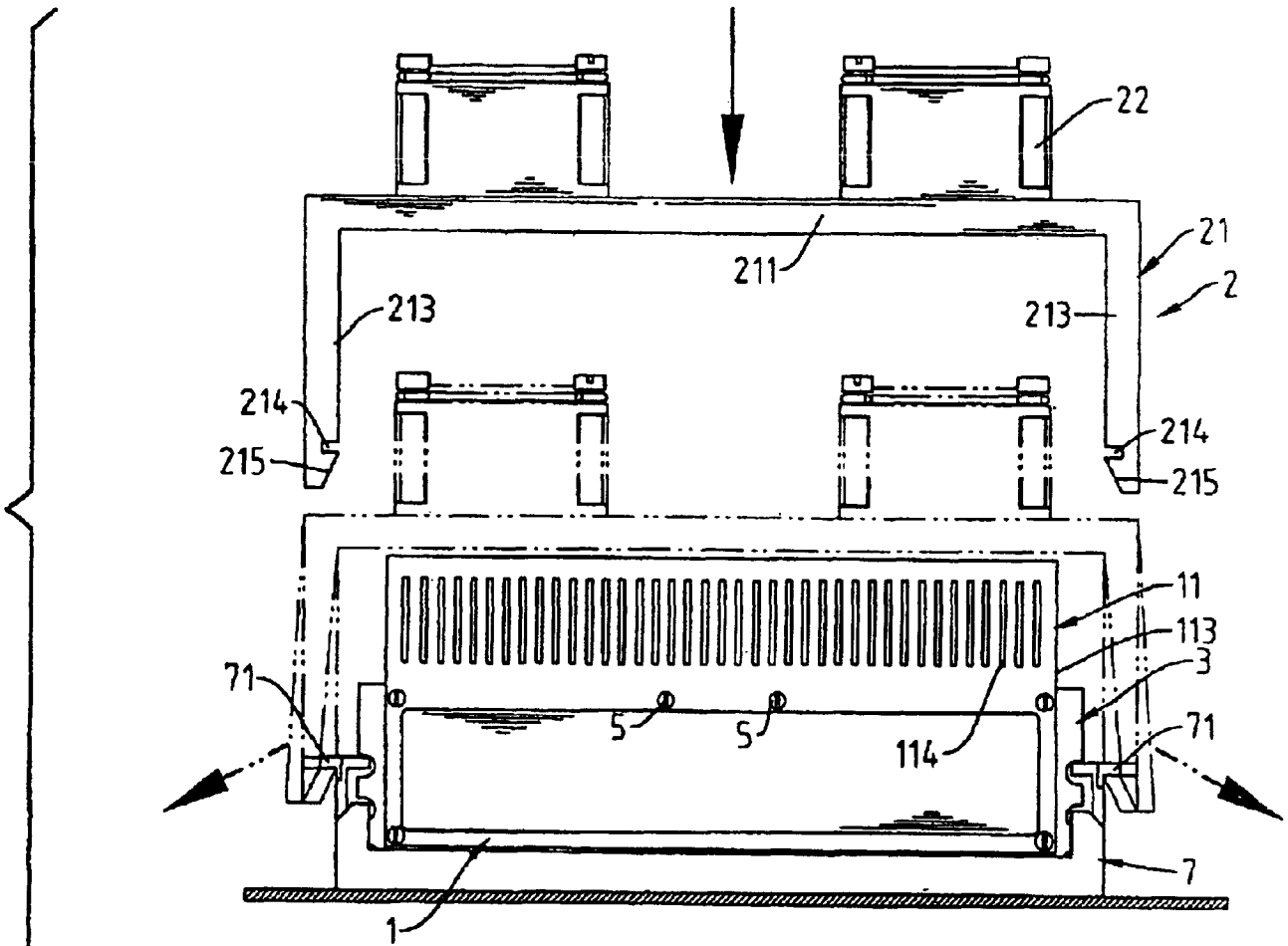
FIG. 7 is an illustration for formation of the frame buckled on the memory socket in the present invention.
Figure 8:
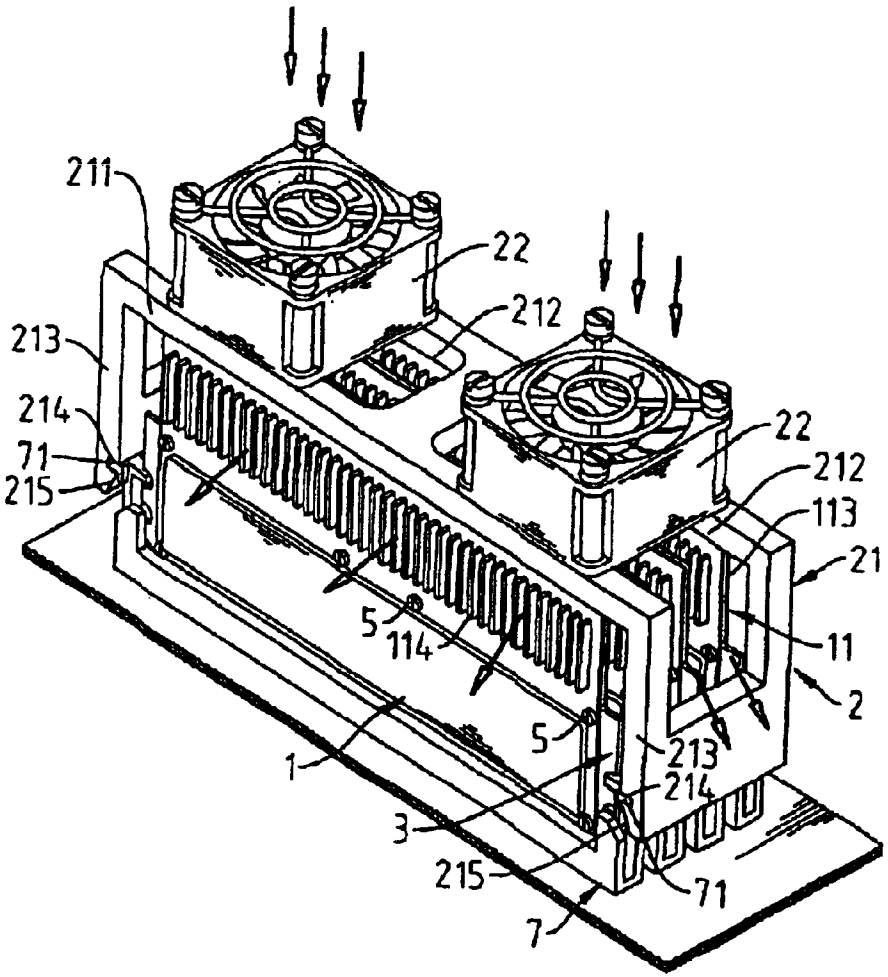
FIG. 8 is an illustration for air convection of the frame bucked on the memory socket in the present invention.

Please refer to FIGS. 6 through 8. Several memory modules 3 are inserted on the memory socket 7 and fixed by hook 71. In this way, when pushing the frame's legs 213 of the frame 21 outward and pushing the bevel 215 at the inner bottom of the two frame's legs 213 toward the hook 71 on both sides of the memory socket 7, the cavity 214 at the inner bottom of the two frames' legs 213 are stuck onto the hook 71 on both sides of the memory socket 7, thus secures the frame 21 above the memory socket 7 with the frame's top 211 and the fan 22 placed above the extension part 113 of the oppositely placed heat sinks 11. In this way, the heat generated by the chip 31 of each pair of memory module 3 is conducted to the extension part 113 through the two heat sinks 11 and the air absorbed by the fan 22 is transmitted to the space above the extension part 113 for ventilation and heat exchange, thus achieves the heat dispensation of the memory module 3 and ensures the performance of the memory module 3.

Figure 9:
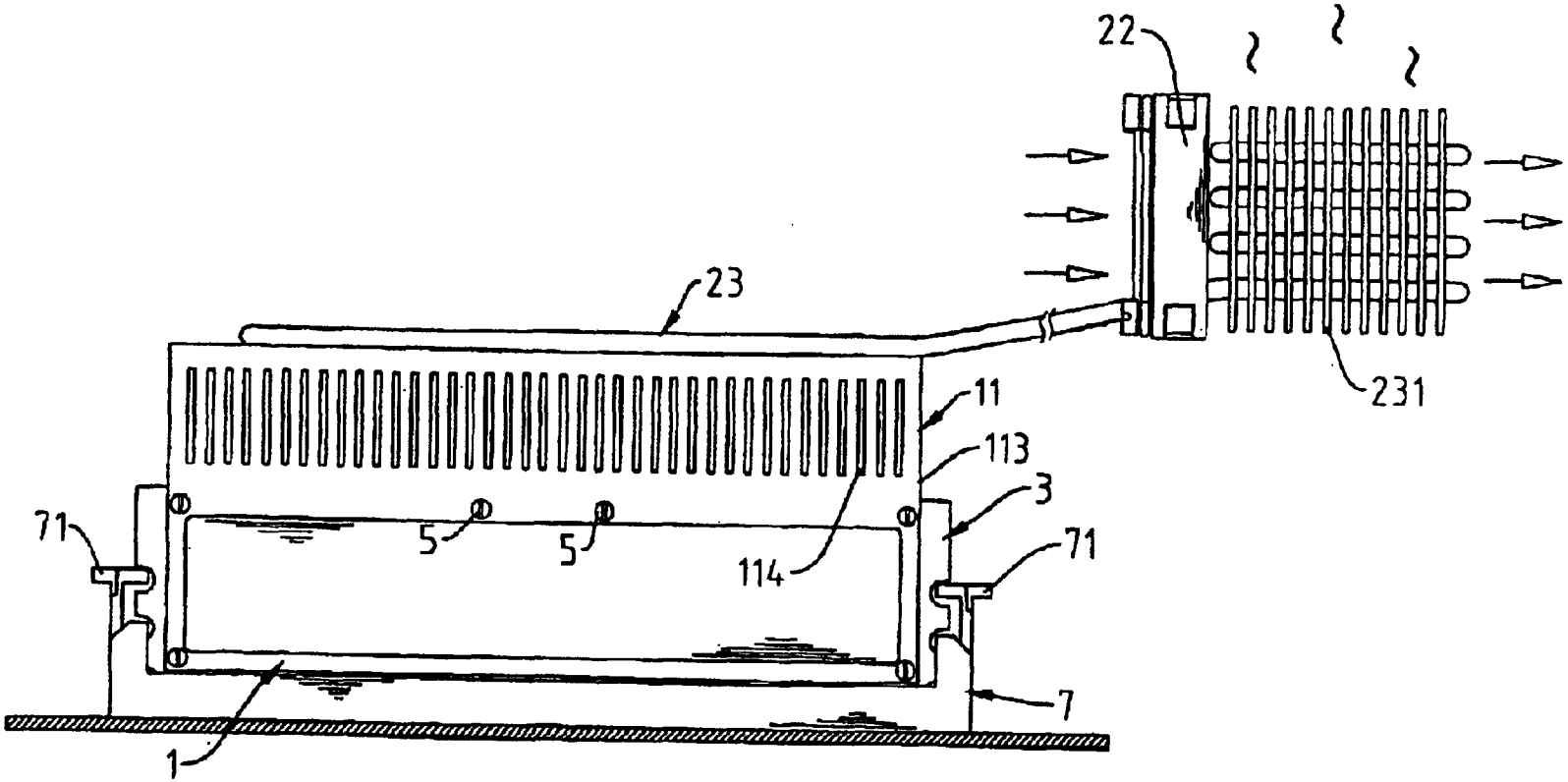
FIG. 9 is a three-dimensional illustration for better application of a removal cooler in the present invention.

Please refer to FIG. 9. The cooler module 2 of the present invention can be a tube combined with a heat-conduction tube 23 and a pair of fans 22. The heat-conduction tube 23 is screwed or tenoned on top of the extension part 113 of the heat sinks 11 and extends outward with heat dispensation fins 231 at the extended end. The fan 22 is placed on one side of the heat dispensation fins 231, allowing the air absorbed by the fan 22 to be transmitted to the space above the heat dispensation fins 231 for heat exchange, thus achieves heat dispensation for the memory module 3 and ensures the performance of the memory module 3.

What is claimed is:

[1. A structure for a removable cooler on a memory module inside a PC, comprising:

a heat sink module is combined by two heat conductive heat sinks placed oppositely and screwed or tenoned on said memory module, stimulating heat exchange by transmitting heat generated by said memory module to space above an extension part of said heat sink;

a cooler module consisting of a frame and at least a pair of fans, on both sides of said frame there are flexible frame's legs and two holes on top of said frame stretching to both sides of said frame for ventilation; one of the at least a pair of fans is placed above each of said frame's holes to enhance ventilation;

thus, several memory modules are inserted separately in memory module sockets of a board and said frame's legs pushed outward are stuck with a hook, allowing a frame's top and said at least a pair of fans to be placed above said extension part of said heat sinks for ventilation, stimulating heat exchange to said extension parts, thus to provide heat dispensation for said memory module.]

[2. The removable cooler for a memory module of claim 1, wherein a cavity and a bevel are set at inner bottom of two frame's legs.]

[3. The removable cooler on a memory module of claim 1, wherein said bevels on both frame's legs are pushed toward a hook on both sides of said memory module to have said cavity inside said frame's legs stuck on said hook and secure said frame above said memory module socket.]

[4. The removable cooler on a memory module of claim 1, wherein there is a concave on said heat sink's opposite side that protects and contacts with a chip protruding from said memory module for direct heat conduction.]

[5. The removable cooler on a memory module of claim 1, wherein a plurality of chips of said memory module and a concave provide heat conduction through a heat conduction interface and said heat conduction interface is one of a heat dispensation ointment and a heat dispensation tape.]

[6. The removable cooler on a memory module of claim 1, wherein there are holes on said heat sinks corresponding to holes on said memory module so as to be screwed or tenoned and secure two heat sinks on said memory module.]

[7. The removable cooler on a memory module of claim 1, wherein there are one of heat dispensation fins and ventilators on said extension part of said heat sinks for ventilation and heat dispensation.]

[8. The removable cooler on a memory module of claim 1, wherein a fan of said frame is placed on a location selected from said frame's top, bottom and two sides for ventilation.]

[9. The removable cooler on a memory module of claim 1, wherein said cooler module is a heat conduction tube; said heat conduction tube is located against said extension part of said heat sink and has heat dispensation fins at an extended end so as to transmit heat of said extension part of said heat sinks; on one side of said heat dispensation fins there is a fan to stimulate heat exchange above said heat dispensation fins, thus provide heat dispensation for said memory module.]

*10. A removable cooler module for a memory module, the memory module being mounted in a memory socket that is secured to a printed circuit board such that a plane of the memory module extends perpendicular to the printed circuit board, the cooler module comprising:*

*a frame including parallel side legs and an upper section extending perpendicular to the parallel side legs and attached to upper ends of the side legs, wherein a lower end of each of the side legs includes an engaging structure, and wherein the upper section defines at least one opening; and*

*at least one fan mounted on the frame,*

*wherein, when the cooler module is mounted on the memory socket over the memory module, the engagement structures engage the memory socket, and the side legs extend perpendicular to the printed circuit board and the upper section of the frame is maintained over an upper edge of the memory module and parallel to the printed circuit board, whereby the fan is positioned to generate air flow over the memory module, and*

*wherein the lower end of each of the side legs includes a bevel, and wherein the engaging structure comprises a cavity defined in said each of the side legs adjacent an upper end of a corresponding one of said bevels.*

*11. The removable cooler module according to claim 10, wherein each of the side legs comprises a flexible material selected such that when the lower ends of the side legs are pressed against the memory socket and the bevels contact hook structures attached to the memory sockets, the side legs flex to accommodate engagement of the hook structures inside corresponding ones of said cavities.*

*12. The removable cooler according to claim 10, wherein said at least one fan comprises:*

*a first fan mounted over said at least one opening adjacent a first end of said upper section, and*

*a second fan mounted over said at least one opening adjacent a second end of said upper section.*

*13. An assembly comprising:*

*a module socket mounted on a printed circuit board;*

*a memory module mounted in the module socket such that a plane of the memory module extends perpendicular to the printed circuit board; and*

*a cooler module including:*

*a frame including a plurality of side legs and an upper section extending between upper ends of the side legs, and*

*at least one fan mounted on the frame,*

*wherein a lower end of each of the side legs is removably engaged with the module socket,*

*wherein the upper section is positioned over an upper edge of the memory module, and*

*wherein the fan is arranged on the frame such that air flow generated by the fan passes along opposing surfaces of the memory module,*

*wherein the module socket includes a hook that is engaged with a side edge of the memory module,*

*wherein the lower end of each of the side legs includes an bevel and defines a cavity, and*

*wherein a portion of the hook is received in the cavity defined by at least one of the side legs of the frame.*

*14. The assembly according to claim 13, wherein each of the side legs comprises a flexible material selected such that when the lower ends of the side legs are pressed against the module socket and the bevels contact first and second hooks attached to opposite ends of the module sockets, the side legs flex to accommodate engagement of the hook structures inside corresponding ones of said cavities.*

*15. The assembly according to claim 13, wherein said at least one fan comprises:*

*a first fan mounted over a first opening defined in said upper section adjacent to a first end of said memory module, and*

*a second fan mounted over a second opening defined in said upper section adjacent to a second end of said memory module.*

*16. The assembly according to claim 13, further comprising a heat sink module including first and second conductive heat sinks mounted over said opposing surfaces of the memory module.*

*17. The assembly according to claim 16, wherein at least one of the first and second conductive heat sinks includes a concave section that contacts a chip protruding from the memory module.*

*18. The assembly according to claim 16, wherein the memory module comprises a plurality of chips that contact at least one of the first and second conductive heat sinks by way of one of a heat dispensation ointment and a heat dispensation tape.*

*19. The assembly according to claim 16, wherein the first and second conductive heat sinks define holes that correspond to holes defined on said memory module, and wherein the first and second conductive heat sinks are secured by fasteners that extend through the holes.*

* * * * *